(12) United States Patent
Ginley et al.

(10) Patent No.: US 8,329,502 B2
(45) Date of Patent: Dec. 11, 2012

(54) CONFORMAL COATING OF HIGHLY STRUCTURED SURFACES

(75) Inventors: David S. Ginley, Evergreen, CO (US); John Perkins, Boulder, CO (US); Joseph Berry, Boulder, CO (US); Thomas Gennett, Denver, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 0 days.

(21) Appl. No.: 12/904,959

(22) Filed: Oct. 14, 2010

(65) Prior Publication Data
US 2012/0091586 A1 Apr. 19, 2012

(51) Int. Cl.
*H01L 23/532* (2006.01)
*H01L 21/283* (2006.01)
(52) U.S. Cl. .................. 438/95; 438/679; 257/E21.159; 257/E23.155
(58) Field of Classification Search .................. 438/95, 438/679; 427/569
See application file for complete search history.

(56) References Cited

U.S. PATENT DOCUMENTS

| | | | | |
|---|---|---|---|---|
| 5,194,131 A | * | 3/1993 | Anderson | 204/192.12 |
| 2008/0261070 A1 | * | 10/2008 | Perkins et al. | 428/640 |
| 2010/0053523 A1 | * | 3/2010 | Umeno et al. | 349/122 |

OTHER PUBLICATIONS

Gennett, T. et al, "Humidity-Resistant High-Conductivity Amorphous-InZnO Transparent Conductors", IEEE, 978-1-4244-2950-9, pp. 1428-1430, 2009.

\* cited by examiner

*Primary Examiner* — Alexander Ghyka
(74) *Attorney, Agent, or Firm* — Paul J. White; W. LaNelle Owens; John C. Stolpa (57) ABSTRACT

Method of applying a conformal coating to a highly structured substrate and devices made by the disclosed methods are disclosed. An example method includes the deposition of a substantially contiguous layer of a material upon a highly structured surface within a deposition process chamber. The highly structured surface may be associated with a substrate or another layer deposited on a substrate. The method includes depositing a material having an amorphous structure on the highly structured surface at a deposition pressure of equal to or less than about 3 mTorr. The method may also include removing a portion of the amorphous material deposited on selected surfaces and depositing additional amorphous material on the highly structured surface.

18 Claims, 8 Drawing Sheets

Fig. 15

CONFORMAL COATING OF HIGHLY STRUCTURED SURFACES

CONTRACTUAL ORIGIN

The United States Government has rights in this invention under Contract No. DE-AC36-08GO28308 between the United States Department of Energy and the Alliance for Sustainable Energy, LLC, the manager and operator of the National Renewable Energy Laboratory.

BACKGROUND

The efficiency or functionality of many types of semiconductor devices can be enhanced by utilizing a substrate or selected device layers having a highly structured surface. As used herein, the term "highly structured surface" refers to any surface, substrate or layer which has structure, surfaces, faces or other topographic features exhibiting non-planar contours in three dimensions. For example, a highly structured surface may include but is not limited to an array or random collection of pillars, pyramids, spikes, valleys, holes, channels, macroscopic roughness or other surface structure which extends away from a generally planar overall structure.

Devices and layers which have a highly structured surface will feature substantially greater actual surface area when compared to a relatively smooth and planar unstructured surface of corresponding overall size. In many instances the increase in overall surface area provided by an appropriately designed highly structured surface can be quite dramatic. Accordingly, substrates or layers featuring a highly structured surface are useful in technologies where chemical or photonic activity occurs over a surface area, including but not limited to photovoltaic cells, batteries and fuel cells.

Most commercially practical processes for the application, deposition or growth of a layer or coating of a selected semiconductor material on to a substrate or underlying layer cause the deposition of material substantially along a line-of-sight between the deposition material source (also known as the target) and the deposition substrate or device. A highly structured surface will necessarily include surfaces which are wholly or partially shaded from the deposition material source or which are presented to the deposition material source at a relatively steep angle. These surfaces, which are defined as "indirect deposition surfaces" herein, are difficult or impossible to coat with an effective thickness of material according to conventional line-of-sight deposition techniques. Material inconsistency, gaps, openings, thin areas or uncoated areas deposited on indirect or shaded surfaces will typically compromise the overall efficiency and functionality of a device featuring semiconductor layers deposited on a highly structured surface.

The embodiments disclosed herein are intended to overcome one or more of the limitations described above. The foregoing examples of the related art and limitations related therewith are intended to be illustrative and not exclusive. Other limitations of the related art will become apparent to those of skill in the art upon a reading of the specification and a study of the drawings.

SUMMARY

One embodiment is a method of applying a conformal coating to a highly structured substrate. The method includes providing a deposition process chamber with a deposition material source. The deposition material source can be a solid substance, a process gas or a combination of both which provides material for molecular or atomic deposition. The method further includes associating a highly structured surface with the deposition process chamber. The highly structured surface may be a substrate or may be the surface of a layer deposited on a substrate or any other underlying layer.

As defined herein, a "highly structured surface" refers to any surface, substrate or layer which has structure, surfaces, faces, extensions, impressions, holes or other topographic features exhibiting non-planar contours in three dimensions. For example, a highly structured surface may include but is not limited to an array or random collection of pillars, pyramids, spikes, valleys, holes, channels, roughness or other surface structure which extends away from a generally planar overall structure. A highly structured surface is also a surface where the three dimensional structure is sufficiently large to transfer the structural character of the surface in three dimensions to another material that is deposited in a conformal manner to the highly structured surface. Nonetheless, a highly structured surface of interest will typically have very small features. A highly structured surface will include one or more direct deposition surfaces having a substantial surface area which is not shaded from the deposition source. In addition, a highly structured surface will include one or more indirect deposition surfaces having a substantial surface area at least partially shaded from the deposition source.

The method will further include depositing a substantially contiguous layer of material having an amorphous structure on both a direct deposition surface and an indirect deposition surface at a deposition pressure of equal to or less than 3 mTorr. The method may further include applying a conformal coating to a highly structured surface where the amorphous material is deposited at a deposition pressure of equal to or less than 0.5 mTorr or equal to or less than 0.1 mTorr.

The conformal coating may be applied to the highly structured surface by any deposition process that may proceed at a deposition pressure of equal to or less than 3 mTorr. For example, the coating may be applied by mixed RF-DC sputtering. In selected embodiments the amorphous material will be deposited at a deposition temperature of less than 200° C., for example in a deposition process that commences at ambient temperature.

The conformal coating may be of any amorphous material. However, in one embodiment the conformal coating is a substantially contiguous layer of a transparent conducting oxide having an amorphous structure. The transparent conducting oxide layer may comprise an InZnO alloy having an amorphous structure.

The method of applying a conformal coating to a highly structured surface may include removing a portion of the amorphous material deposited on a direct deposition surface and depositing additional amorphous material on both the direct deposition surface and an indirect deposition surface. Material may be removed from a direct deposition surface by any appropriate means, for example ion milling or chemical etching. In certain instances the method will include applying a protective coating to an indirect deposition surface prior to the removal of material from a direct deposition surface.

An alternative embodiment is a semiconductor device comprising a highly structured surface as described above. The device further includes a conformal coating layer applied, deposited or grown upon the highly structured surface such that the conformal coating substantially contiguously coats both a direct deposition surface and an indirect deposition surface. Alternative embodiments include an electronic device of any complexity prepared according to the methods disclosed herein.

The following embodiments and aspects thereof are described and illustrated in conjunction with systems, tools and methods which are meant to be exemplary and illustrative, not limiting in scope. In various embodiments, one or more of the above-described problems have been reduced or eliminated, while other embodiments are directed to other improvements.

In addition to the exemplary aspects and embodiments described above, further aspects and embodiments will become apparent by reference to the drawings and by study of the following descriptions.

BRIEF DESCRIPTION OF THE DETAILED DRAWINGS

Exemplary embodiments are illustrated in referenced figures of the drawings. It is intended that the embodiments and figures disclosed herein are to be considered illustrative rather than limiting.

DESCRIPTION

Unless otherwise indicated, all numbers expressing quantities of ingredients, dimensions, reaction conditions and so forth used in the specification and claims are to be understood as being modified in all instances by the term "about".

In this application and the claims, the use of the singular includes the plural unless specifically stated otherwise. In addition, use of "or" means "and/or" unless stated otherwise. Moreover, the use of the term "including", as well as other forms, such as "includes" and "included", is not limiting.

Also, terms such as "element" or "component" encompass both elements and components comprising one unit and elements and components that comprise more than one unit unless specifically stated otherwise.

A deposited material may be described herein as being crystalline or amorphous. Crystalline shall be understood to mean substantially crystalline, and having sufficiently well developed crystal structure. The terms single crystal or crystalline do not mean absolutely defect free. Most types of crystalline material will have defects and or dislocations. A material may alternatively be described as an "amorphous material" or a material or layer having an "amorphous structure." An amorphous material is defined as a material having a disordered atomic structure without substantial crystalline structure.

Certain abbreviations may be made herein with respect to the description of semiconductor alloys. These abbreviations shall not be construed as limiting the scope of the disclosure or claims. For example, the form "InZnO" or IZO are commonly recognized abbreviations for an Indium Zinc Oxide semiconductor alloy. InZnO may be prepared in any number of constituent ratios ranging from nearly pure ZnO with only trace amounts of indium to nearly pure $In_2O_3$ with only trace amounts of zinc. Abbreviated forms such as "InZnO" or IZO are defined as equivalent to the entire family of alloys in an expanded form, for example; "$In_xZn_yO_{(1-x-y)}$."

The various embodiments disclosed herein include methods of applying a conformal coating, layer or film to a highly structured surface or substrate. Devices featuring a highly structured surface with conformal coatings or layers applied thereon are also disclosed. As defined herein, the phrase "highly structured surface" refers to any surface, substrate or layer which has structure, surfaces, faces, extensions, impressions, holes or other topographic features exhibiting non-planar contours in three dimensions. For example, a highly structured surface may include but is not limited to an array or random collection of pillars, pyramids, spikes, valleys, holes, channels, roughness or other surface structure which extend away from or into a generally planar overall structure.

Inherent in the definition of a highly structured surface is the understanding that the structure is at least slightly larger than the structure of any material deposited as a film or coating on the surface. For example, virtually all substrates or surfaces have a three dimensional structure at an atomic or molecular level, no matter how finely polished the surface may be. A surface which is structured only at the atomic or molecular level will typically appear and behave as a substantially flat or unstructured surface when another material is deposited thereon. Accordingly, a highly structured surface as defined herein is one where the three dimensional structure is sufficiently large to transfer the structured character of the surface in three dimensions to another material that is deposited in a conformal manner on the highly structured surface. Typically, highly structured surfaces of interest will have very small features. For example, a typical highly structured surface of interest may include nanometer sized or micron sized structural features. A material deposited thereon will be somewhat conformable and at least initially resists bridging across all structural features. As deposition progresses, it is possible that substantial bridging may occur under normal deposition conditions.

One representative highly structured surface described in detail below features an array of pillar structures each about 0.5 to 3 μm in height. The centers of the pillars are spaced approximately 800 nm apart. Surfaces having relatively smaller and relatively larger structural features can be coated using the methods described herein.

Figure 1:
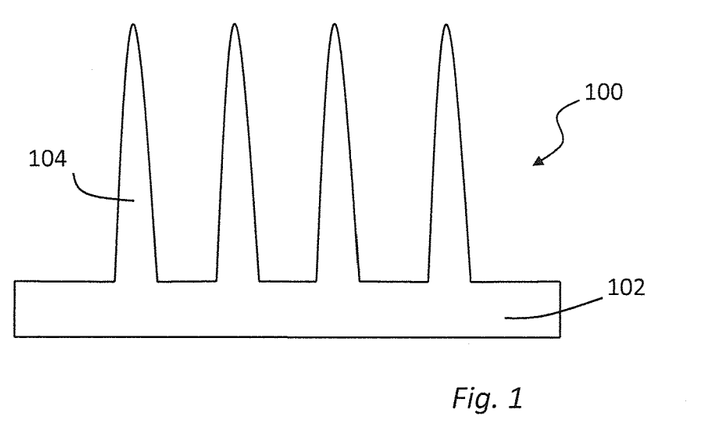
FIG. 1 is schematic diagram of a highly structure surface.

A schematic diagram of a representative highly structured surface is included in FIG. 1. FIG. 1 shows a substrate 100 which features a base portion 102 and an array of conical pillars 104 extending away from the base structure. Although the highly structured surface of FIG. 1 is represented as a substrate 100, it is important to note that the highly structured surface may be an epilayer, sub-layer or other material having a highly structured surface.

Many semiconductor devices are fabricated by depositing a layer of one semiconductor material onto a substrate or intervening layer. Deposition upon a highly structured surface presents significant technical challenges because most commercially practical deposition techniques involve the line-of-sight transfer of ions or atoms from a material source or target to the deposition substrate or other surface where the material is intended to be deposited.

Figure 2:
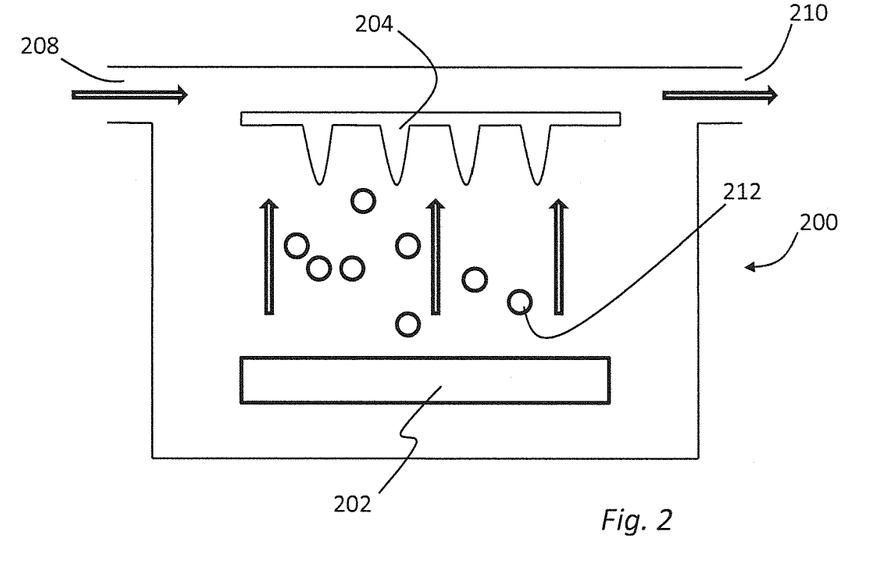
FIG. 2 is a schematic diagram of a deposition process chamber.

For example, various types of sputter deposition techniques are commonly used to deposit or grow the layers of a semiconductor device. Sputtering is a physical vapor deposition (PVD) process well known for depositing thin films such as metal oxide layers on a substrate or on other layers. FIG. 2 is a schematic representation of a highly simplified sputter deposition chamber 200. It may be noted that FIG. 2 shows a small deposition chamber 200 such as might be found in a laboratory. The methods disclosed herein are equally applicable to larger industrial process deposition chambers as well, which chambers may include additional elements such as conveyor devices and multiple deposition material sources.

The deposition chamber 200 illustrated in FIG. 2 includes a deposition material source 202, commonly referred to as a "target" in sputter implementations. The deposition material source 202 provides some or all of the material which is desired for deposition on a substrate 204. For example, the deposition material source 202 selected for depositing a metal oxide film may be a metal, a combination of metals or a ceramic metal oxide alloy. If the deposition material source 202 is a metal or combination of metals, an oxide may be deposited by including oxygen in the sputter atmosphere. Thus, although the deposition material source 202 is illustrated as a solid material in FIG. 2, in alternative deposition methods, the deposition material source may be provided wholly or partially in a gas phase.

Molecules of an inert sputtering gas may enter and exit the deposition chamber 200 through openings 208 and 210. A reactive gas such as oxygen which is chosen to combine with atoms or ions released from the deposition material source 202 to form the material deposited on the substrate 204 may also enter the deposition chamber 200 through the opening 208.

In deposition techniques such as DC or RF sputtering, the deposition chamber is operated at a selected deposition pressure which is significantly lower than atmospheric pressure. The composition of a deposited layer and its optical, electrical and mechanical characteristics can be controlled and modified by varying parameters such as the deposition pressure, deposition temperature, sputter material source composition, reactive sputter gas composition, inert sputter gas composition, the physical arrangement of the substrate and sputter material source and other factors. The availability of many parameters that affect the outcome of a deposition process provides experts with a large degree of control over the growth structure and characteristics of the resulting deposited film.

Figure 3:
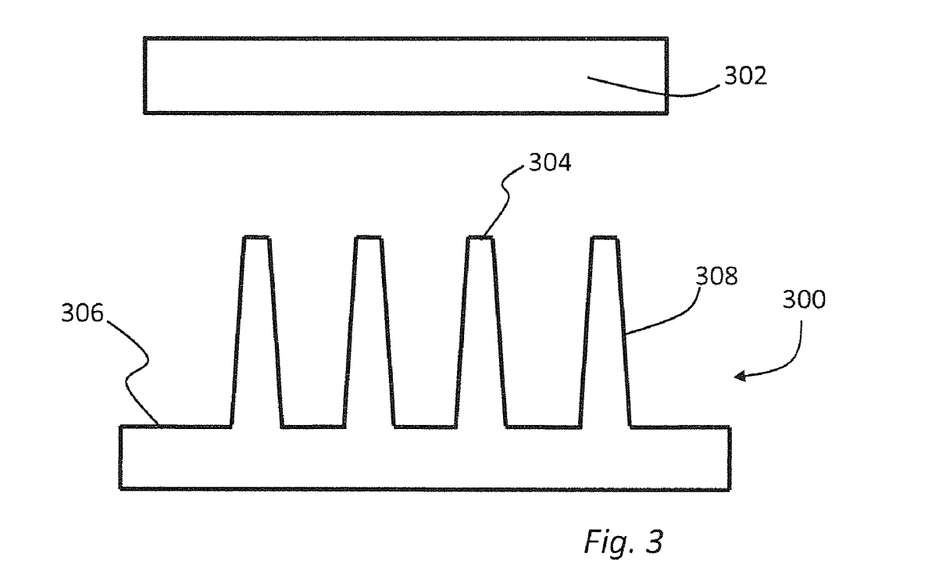
FIG. 3 is a schematic diagram of a highly structure surface and deposition material source within a deposition process chamber.

Deposition of a conformal film upon a highly structured surface is technically challenging because, as shown in FIG. 2, the material 212 to be incorporated in the deposited layer is generally transported from the deposition material source 202 to the substrate 204 along substantially straight line-of-sight lines. Accordingly, as shown in the schematic diagram of FIG. 3, certain areas of a highly structured surface 300 will face substantially toward the deposition material source 302 and are thus readily available for deposition. These surfaces are defined as "direct deposition surfaces" herein and are represented by direct deposition surfaces 304 and 306 of FIG. 3. Other surfaces are either wholly or partially shaded from the deposition material source 302. Shading can be caused by direct deposition surfaces or by previously deposited material. These wholly or partially shaded surfaces are defined herein as "indirect deposition surfaces." A representative indirect deposition surface 308 is shown on FIG. 3. Generally, an indirect deposition surface will not have a substantial area, relative to the entire area of the subject indirect surface, which faces the deposition material source or which is substantially perpendicular to a line-of-sight between the deposition material source and substrate. Thus, as shown in FIG. 3, the sidewalls of a pillar structure or a corresponding hole or similar structure are typically indirect deposition surfaces since these surfaces define areas that are wholly or partially shaded from the deposition material source.

Other types or configurations of highly structured surface will have indirect deposition surfaces having different shapes and orientations. In all cases, however, an indirect deposition surface will be wholly or partially shaded from the deposition material source at some point during the deposition process. Accordingly, a relatively thin and possibly incomplete film will be deposited on an indirect deposition surface by a conventional deposition process.

The problems associated with the deposition of a suitably thick and conformal film or coating on an indirect deposition surface have been initially described above with respect to a sputter deposition process and sputtering chamber. These technical challenges and the methods and devices disclosed herein to overcome the challenges are equally applicable to other types of deposition process including but not limited to RF, DC, pulsed-DC and RF-DC mixed sputtering; chemical vapor deposition; pulsed laser deposition; plasma enhanced vapor deposition or other deposition techniques. In each case the challenge presented concerns the deposition of a suitably thick and consistent coating on indirect deposition surfaces.

Figure 4:
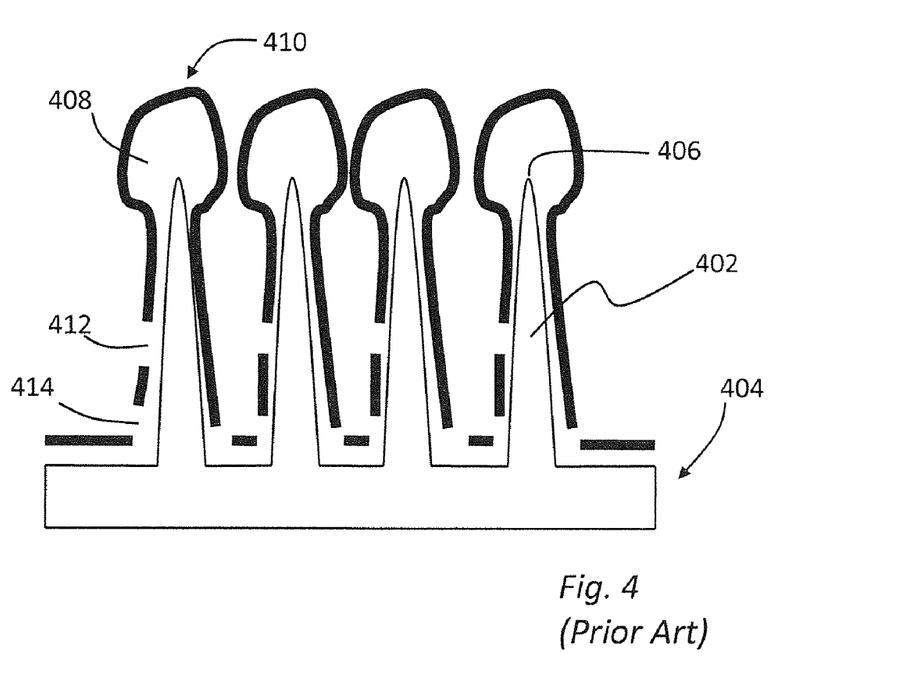
FIG. 4 (prior art) is a schematic diagram showing an inconsistent and incongruous coating applied to a highly structure surface according to prior art methods.
Figure 5:
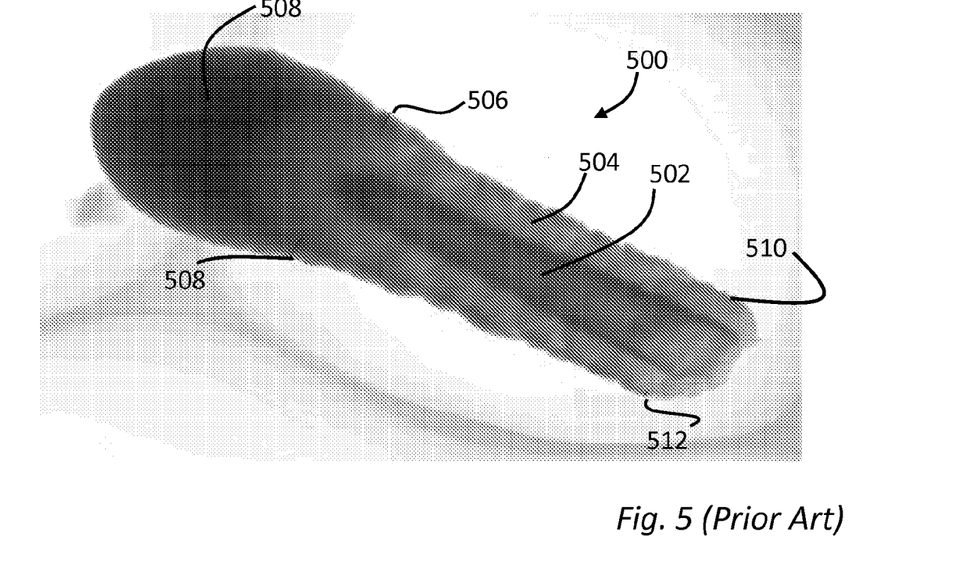
FIG. 5 (prior art) is an electron micrograph of a non-amorphous coating applied to a pillar structure by prior art methods.

The technical challenges presented by the deposition of a conformal coating or layer to a highly structured surface can be exacerbated by the tendency of a deposited material to form a cap on any direct deposition surface which is relatively closer to the deposition material source. The cap will typically expand as deposition progresses. For example, FIG. 4 illustrates substantially conical pillars 402 of a highly structured surface 404 which have been placed into a deposition chamber such that the "tops" 406 of the pillars 402 face toward a deposition material source. Thus, the tops 406 of the conical pillars 402 are a direct deposition surface as defined above. As deposition progresses, deposition material 408 deposited on the highly structured surface 404 will develop into an enlarged cap 410 on each top 406, An electron micrograph of a pillar structure 500 having a inner cone 502 and outer shell 504 is shown in FIG. 5. As is clearly illustrated in FIG. 5, a transparent conductive oxide coating 506 deposited on the conical structure 502 by known deposition methods formed a relatively large and thick cap 508 on the tip of the pillar structure 500 and formed a dramatically thinner and inconsistent coating 510 on the conical structure sidewalls.

This deposition pattern is further illustrated in FIG. 4 where it may be noted that the material deposited on a sidewall or other indirect deposition surface may include gaps 412 or discontinuities, particularly on the portions of the conical pillar 402 which are furthest away from the deposition source, for example, at the junction 414 which receives the most shading. It will also be readily appreciated that the growth of a cap 408, 508 substantially exacerbates the shading problem and causes the material deposited on indirect deposition surfaces after the initial phases of deposition to be very thin if additional material is deposited at all.

Figure 6:
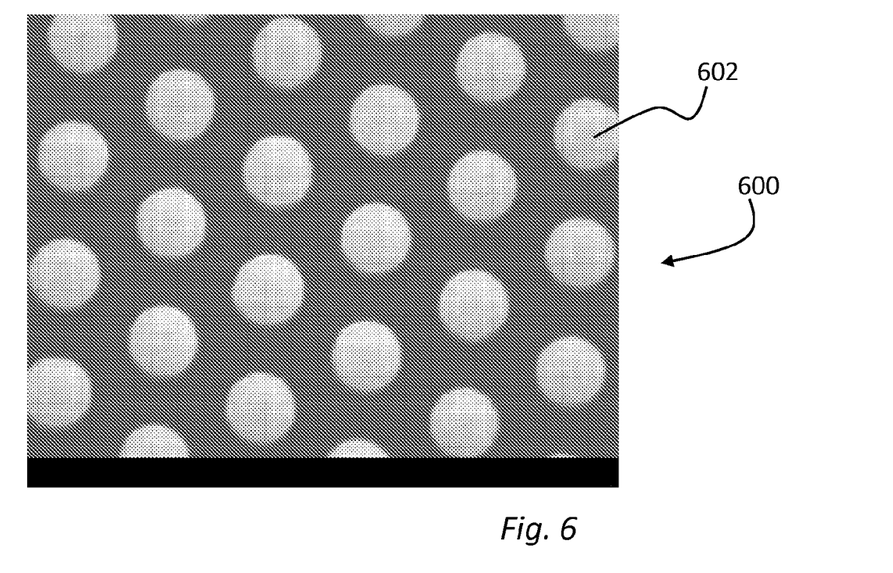
FIG. 6 is a plan view electron micrograph of a substrate including pillar structures prior to a deposition process.
Figure 7:
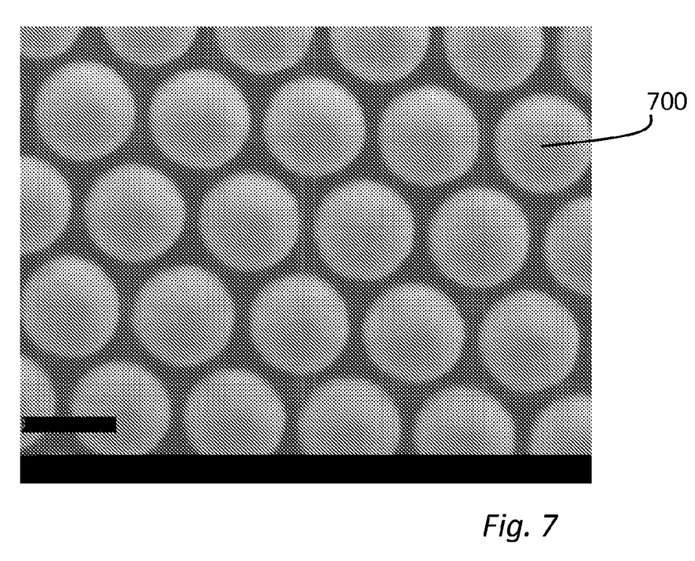
FIG. 7 is a plan view electron micrograph of the substrate of FIG. 6 after 40 minutes of conventional sputter deposition.
Figure 8:
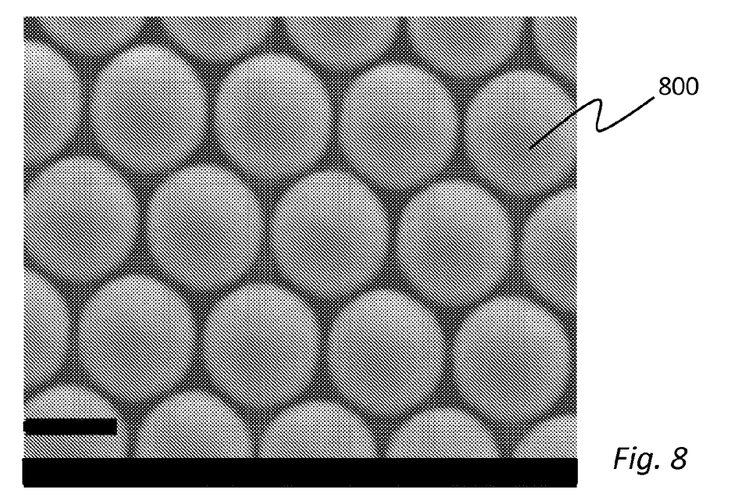
FIG. 8 is a plan view electron micrograph of the substrate of FIG. 6 after 60 minutes of conventional sputter deposition.

FIGS. 6-8 are electron micrographs which further illustrate the development of cap structures when conventional deposition techniques are use on highly structured surfaces. FIG. 6 shows a substrate 600 including an array of pillars 602, each about 0.5 to 3 μm in height. The centers of the pillars are spaced approximately 800 nm apart. FIG. 7 shows the same array of pillars after 40 minutes of conventional sputter deposition. Clearly caps 700 have grown on the tops of each pillar. It will be noted that the caps 700 exacerbate the shading of the pillar side walls. FIG. 8 is the same array of pillars after 60 minutes of sputter deposition. At this point in the deposition process, the caps 800 have grown to a point where the shading of the pillar sidewalls is substantially complete.

Several distinct methods have been developed to address the technical challenge presented by the deposition of a conformal coating on a highly structured surface. The methods disclosed herein may be implemented independently or in combination with each other. The methods disclosed herein are described with respect to selected sputtering methodologies, in particular, a mixed RF-DC sputtering technique. However, the disclosed methods are also applicable to other coating or deposition methods.

In general, sputter deposition relies upon plasma sustained from an inert sputter gas to energize the deposition material. High energy particles of the plasma transfer energy to the deposition material source freeing ionic or atomic species for subsequent deposition on the deposition surface. Sputter deposition systems may be categorized by the power source used to generate the plasma. The simplest sputtering system is a direct current diode system (DC sputtering). DC sputtering typically occurs at a deposition pressure of 5 mTorr to perhaps 100 mTorr. Alternative methods such as RF sputtering can be used while maintaining plasma at lower deposition pressures. For any sputtering technique however, increasing the deposition pressure will result in an increased level of energy imparted by the plasma to the deposition material source and relatively higher deposition material mobility. Thus, an appropriate and controlled increase in the deposition atmosphere pressure will result in relatively quicker, thicker material deposition upon conventional surfaces. It may be expected that increasing the deposition pressure helps to overcome the technical challenges presented by an attempt to sputter deposit a conformal coating onto a highly structured surface. It may be expected that an enhanced deposition rate and the enhanced mobility of more energetic particles of deposition material causes, the deposition of a relatively thicker layer of material on shaded indirect deposition surfaces.

In direct contrast to the expected results, it has been found that increasing the sputter atmosphere pressure negatively impacts the ability to deposit a conformal coating on a highly structured surface. On the contrary it has been determined that sputtering at unconventionally low sputter pressures enhances the likelihood of applying a sufficiently thick conformal coating to a highly structured surface. An unconventionally low sputter pressure is defined herein as a pressure of equal to or less than 3 mTorr. Thus, as detailed in the examples set forth below, it has been determined that the deposition of a conformal coating of a transparent conducting oxide on the indirect deposition surfaces of a highly structured substrate is enhanced if the deposition atmosphere pressure of an RF-DC mixed sputtering process is maintained at or below 3.0 mTorr. Further improved results were obtained at a deposition atmosphere pressure of 0.5 mTorr and 0.1 mTorr which are well below the pressures conventionally used for sputtering.

Various sputter parameters may be controlled to determine the structural characteristics of a deposited material. For example, it is desirable for many types of semiconductor devices to deposit a transparent conducting oxide layer over a substrate or another layer. The structure of many known transparent conducting oxides can range from a highly crystalline to amorphous depending upon factors such as the alloy component ratios and deposition temperature. One commonly deposited transparent conducting oxide is Indium Tin Oxide (ITO). ITO tends to have a crystalline structure when deposited according to known techniques. Crystalline structure can be detrimental to the application of a substantially contiguous conformal coating over a highly structured surface. In particular, crystalline surfaces tend toward the maintenance of established growth planes and thus resist conformality to surfaces having adjacent structural surfaces with an area smaller than the area of typical crystal grains.

Figure 9:
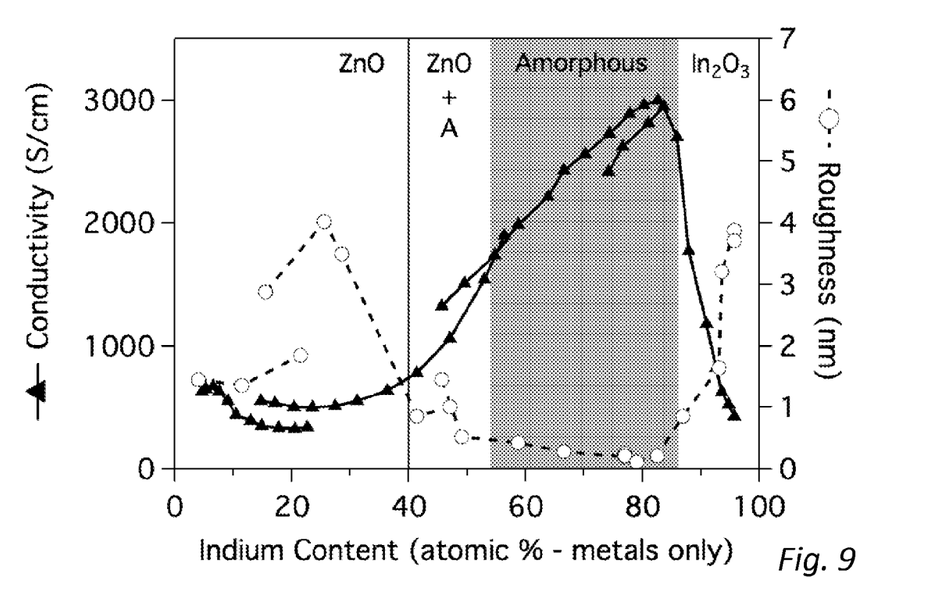
FIG. 9 is a graphic representation of selected characteristics of InZnO alloy materials.

The difficulties presented by the application of a crystalline material to a nano-scaled or micron-scaled highly structured surface may in part be overcome by selecting a suitable amorphous material for deposition. For example, Indium Zinc Oxide (IZO) is an alternative transparent conducting oxide that can be deposited in an amorphous state while maintaining useful optical and electrical properties. As shown graphically in FIG. 9, IZO deposited with a atomic percentage ratio of about 54% to 86% indium corresponding to about 46% to 14% zinc will have an amorphous structure and suitable electrical and optical properties for use in many devices requiring transparent conducting oxide layers. As shown in FIG. 9, the amorphous materials prepared at suitable atomic constituent percentage ratios have significantly lower surface roughness than IZO alloys prepared to have a crystalline structure. The amorphous structure of suitably prepared IZO enhances the ability of this material to form a conformal coating over a highly structured surface, particularly when deposited at relatively low deposition pressures as described above.

As noted above, the cap which typically forms on a pillar type structure can interfere with the deposition of a conformal coating on indirect deposition surfaces which are shaded by either the substrate or the expanding cap. Various techniques may be used to remove or modify a cap such that subsequent or ongoing deposition steps can increase the thickness of the material deposited underneath the cap, on indirect deposition surfaces. For example, a portion of the material deposited in a cap may be removed by ion milling, chemical etching or another process. Cap removal may occur either in between deposition steps, or in certain instances during deposition. When a method of sequential deposition and cap removal is used, it may be desirable to protect indirect deposition surfaces from the effects of etchant or ionic milling. Thus, indirect deposition surfaces such as the channels between the pillars of the substrate 600 of FIG. 6 might be filled with photoresist or another inert material prior to the chemical etch or milling of the direct deposition surface caps. Subsequently, the protective coating can be removed and one or more supplemental layers of material can be deposited. Subsequent deposition steps will tend to re-build the cap but will also increase the thickness and quality of the material deposited on indirect surfaces such as pillar side walls. In embodiments where ion milling is used to remove the cap, this process may also proceed during deposition. Ion milling process can also be applied at selected angles relative to the highly structured surface to achieve the removal of highly specific portions of a cap or other deposited structure.

Many types of highly structured substrate are relatively fragile. Accordingly, steps may be necessary to avoid destroying the structure of the surface or substrate during deposition. For example, deposition processes which limit the deposition temperature to 200 or below will tend to protect delicate nano or micron scaled features from thermal shock and fracture. Deposition processes that commence at ambient temperature and employ no supplemental heating are well suited to protecting surface features, in particular where the deposition power is controlled to limit the final deposition temperature to less than 200° C.

EXAMPLES

The following examples are provided for illustrative purposes only and are not intended to limit the scope of any embodiment disclosed herein.

Example 1

ITO Coated Pillar

FIG. 5 is and electron micrograph of a pillar structure 500 sputter coated with the transparent conducting oxide Indium Tin Oxide (ITO) according to previously known sputter techniques. ITO is typically crystalline in nature. It may be noted from the image of FIG. 5 that the deposited cap 508 is dramatically thicker that the material 506, 510 deposited on the pillar sidewalls. In particular the ITO layer deposited at location 506 and 508 near the cap is 71 nm and 109 nm respectively, while the thickness of ITO deposited away from the cap, at locations 510 and 512 are 28 nm and 35 nm respectively. It may also be observed from FIG. 5 that the crystalline ITO coating is relatively lumpy, inconsistent and subject to gaps.

Example 2

IZO Coated Pillar—4.5 mTorr Deposition Pressure

Figure 10:
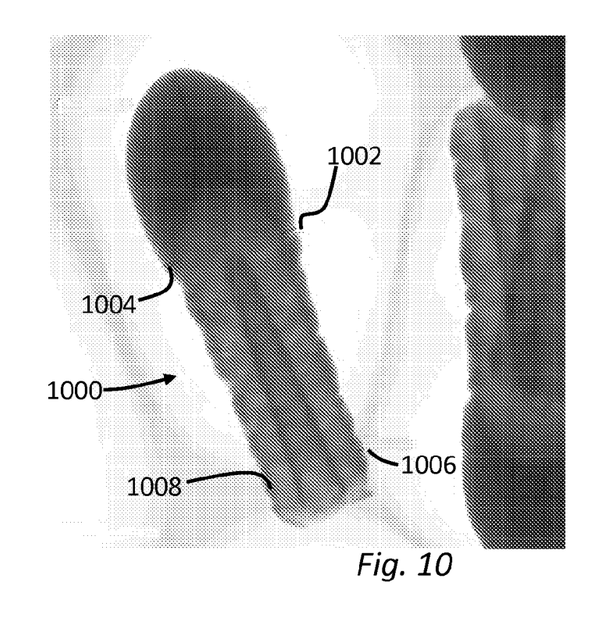
FIG. 10 is an electron micrograph of a pillar structure after the deposition of an amorphous material at a deposition pressure of 4.5 mTorr.

FIG. 10 is an electron micrograph of a pillar structure 1000 sputter coated with the transparent conducting oxide Indium Zinc Oxide (IZO). The applicable sputter parameters were controlled to deposit an IZO layer having an amorphous structure. The IZO layer illustrated in FIG. 10 was deposited by mixed RF-DC sputtering in a single deposition of 40 minutes. The deposition chamber was not heated, thus the deposition temperature commenced at ambient temperature. Deposition occurred at a sputter atmosphere pressure of 4.5 mTorr. It may be noted from the image of FIG. 10 that the IZO layer deposited at location 1002 and 1004 near the cap is 104 nm and 78 nm respectively, which correspond to the thicknesses observed in example 1. The thickness of IZO deposited away from the cap is approximately two times thicker than that deposited in example 1, indicating that substantial improvements in sidewall coverage occurred through the use of an amorphous deposition material. In particular, the IZO layer deposited at locations 1006 and 1008 are 64 nm and 47 nm respectively. It may also be observed from FIG. 10 that the sidewall coating is somewhat smoother and more uniformly consistent in coverage than the coating of FIG. 5. The enhanced thickness and enhanced coverage achieved by the use of an amorphous material resulted in an increase in device efficiency by approximately 10%, from 5.0 to 5.5%. The pillars of example 1 and example 2 were fabricated for use in a photovoltaic cell utilizing a highly structured substrate.

Example 3

IZO Coated Pillar—0.5 mTorr Deposition Pressure

Figure 11:
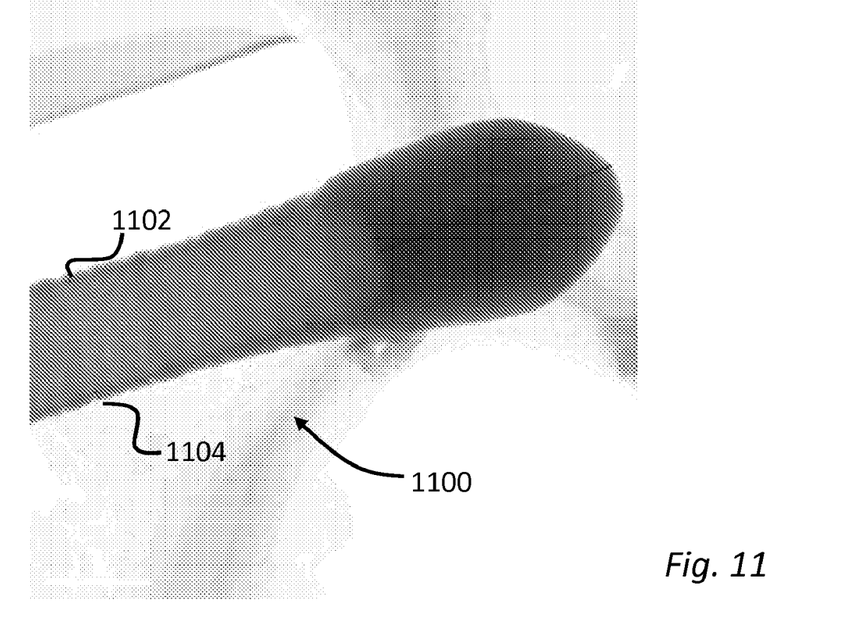
FIG. 11 is an electron micrograph of a pillar structure after the deposition of an amorphous material at a deposition pressure of 0.5 mTorr.

FIG. 11 is and electron micrograph of a pillar structure 1100 sputter coated with the transparent conducting oxide Indium Zinc Oxide (IZO). The applicable sputter parameters were controlled to deposit an IZO layer having an amorphous structure. The IZO layer illustrated in FIG. 11 was deposited by mixed RF-DC sputtering in a single deposition of 40 minutes. The deposition chamber was not heated, thus the deposition temperature commenced at ambient temperature. Deposition occurred at a sputter atmosphere pressure of 0.5 mTorr. It may be noted from the image of FIG. 12 that the IZO layer deposited at locations 1102 and 1104 are 47 nm and 50 nm respectively. In addition, it may be observed that the IZO layer applied at 0.5 mTorr deposition pressure is exceptionally smooth and complete with no observable gaps or substantial inconsistencies.

Example 4

IZO Coated Pillar—0.1 mTorr Deposition Pressure

Figure 12:
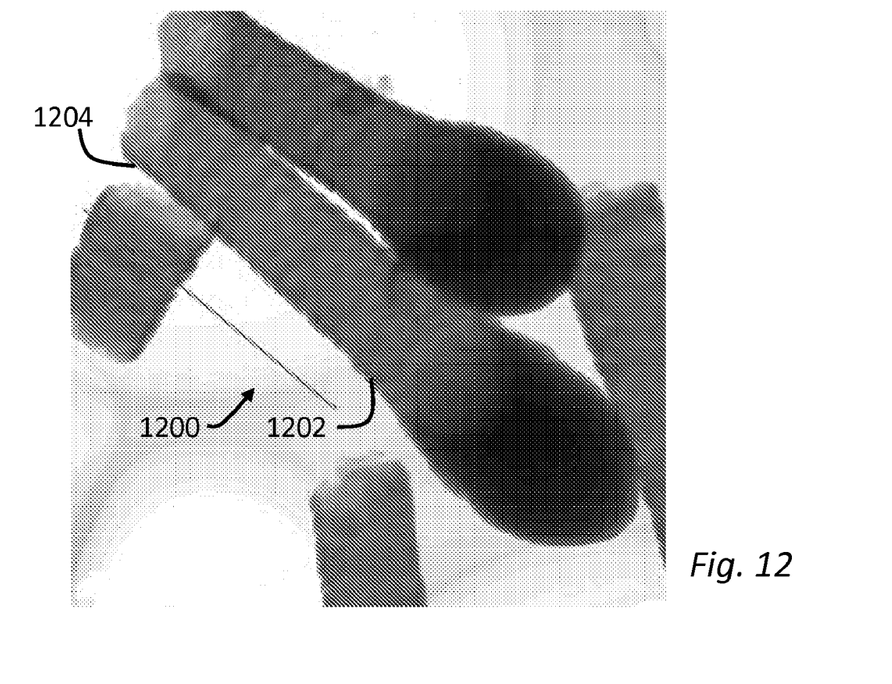
FIG. 12 is an electron micrograph of a pillar structure after the deposition of an amorphous material at a deposition pressure of 0.1 mTorr.

FIG. 12 is and electron micrograph of a pillar structure 1200 sputter coated with the transparent conducting oxide Indium Zinc Oxide (IZO). The applicable sputter parameters were controlled to deposit an IZO layer having an amorphous structure. The IZO layer illustrated in FIG. 12 was deposited by mixed RF-DC sputtering in a single deposition of 180 minutes. The deposition chamber was not heated, thus the deposition temperature commenced at ambient temperature. Deposition occurred at a sputter atmosphere pressure of 0.1 mTorr. It may be noted from the image of FIG. 12 that the IZO layer deposited at locations 1202 and 1204 are 36 nm and 39 nm thick respectively, which demonstrates a great deal of uniformity in coating thickness from the sidewall near the top of the pillar to a location on the sidewall near the bottom. This top to bottom thickness consistency is not present in the pillars which are the subject of Examples 1 and 2. In addition, it may be observed that the IZO layer applied at 0.1 mTorr deposition pressure is exceptionally smooth and complete with no observable gaps or substantial inconsistencies.

Table 1 below provides a summary of the deposition parameters and selected characteristics of the pillars coated in Examples 1 to 4 above. All IZO samples were deposited by mixed RF-DC sputtering with 50 Watts total power, 25 Watts RF+25 Watts DC. All IZO samples were deposited with 1% $O_2$ in Ar as the sputtering gas.

TABLE 1

| Coating Material | Deposition Distance (inches) | Deposition Pressure (mTorr) | Deposition Time (minutes) | Coating Thickness (nm) | |
|---|---|---|---|---|---|
| | | | | Left Top L. Bottom | Right Top R. Bottom |
| ITO (ref) | | | | 109 | 71 |
| FIG. 5 | | | | 35 | 28 |
| a-IZO | 3 | 4.5 | 40 | 78 | 104 |
| FIG. 10 | | | | 47 | 64 |
| a-IZO | 3 | 0.5 | 40 | | |

TABLE 1-continued

| Coating Material | Deposition Distance (inches) | Deposition Pressure (mTorr) | Deposition Time (minutes) | Coating Thickness (nm) Left Top L. Bottom | Coating Thickness (nm) Right Top R. Bottom |
|---|---|---|---|---|---|
| FIG. 11 | | | | 47 | 50 |
| a-IZO | 6 | 0.1 | 180 | | 36 |
| FIG. 12 | | | | | 39 |

Example 5

Ion Milling of Caps

Figure 13:
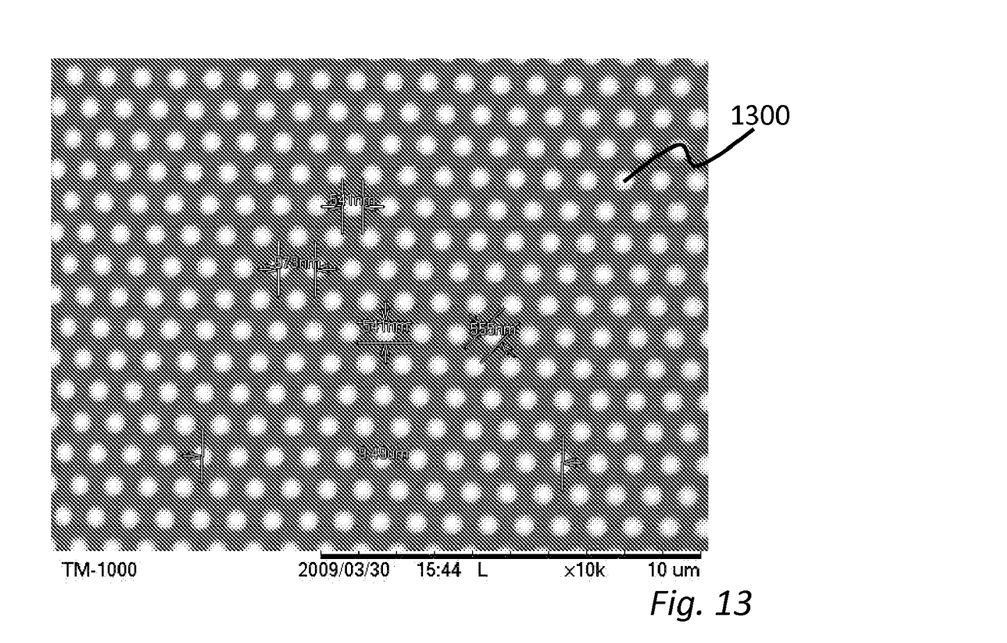
FIG. 13 is an electron micrograph of a substrate having pillar structures after deposition.
Figure 14:
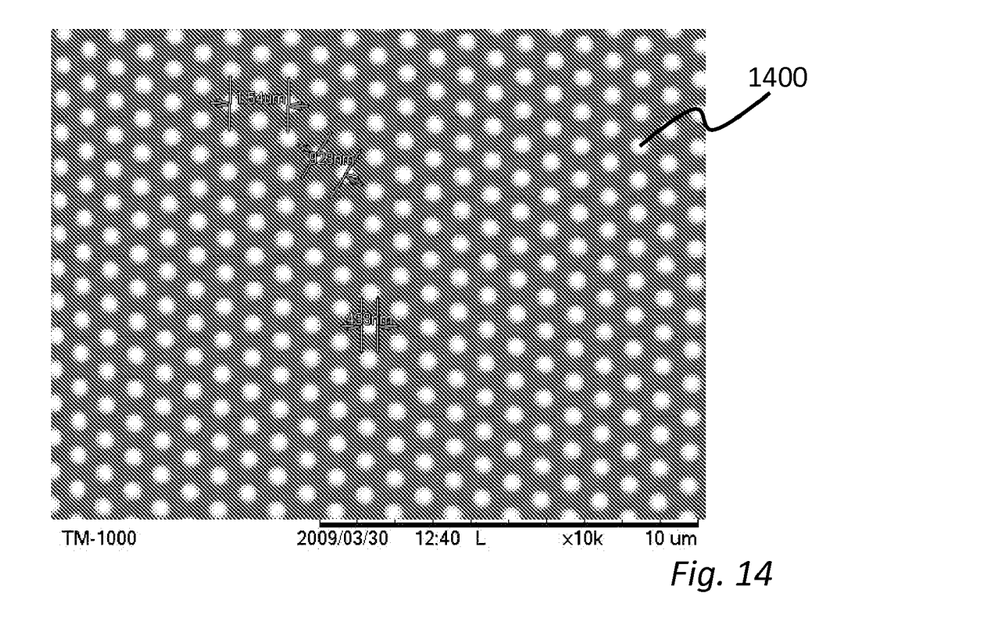
FIG. 14 is an electron micrograph of the substrate of FIG. 13 after deposition and subsequent ion milling.

FIGS. 13 and 14 are electron micrographs of a highly structured surface having an array of pillars after deposition of a transparent conducting oxide later. As shown in FIG. 13, immediately after deposition, the pillars exhibited TCO caps 1300 having a diameter of approximately 540 to 550 nm. The substrate of FIG. 13 was subjected to ion milling after the measurement of the caps. The results of the ion milling step are shown in FIG. 14. Ion milling reduced the average cap 1400 diameter to about 440 nm or less, demonstrating that at least 100 nm of a cap diameter is readily removed by ion milling, which results in an increase in the thickness of material deposited on indirect deposition surfaces under the cap in subsequent deposition steps.

Figure 15:
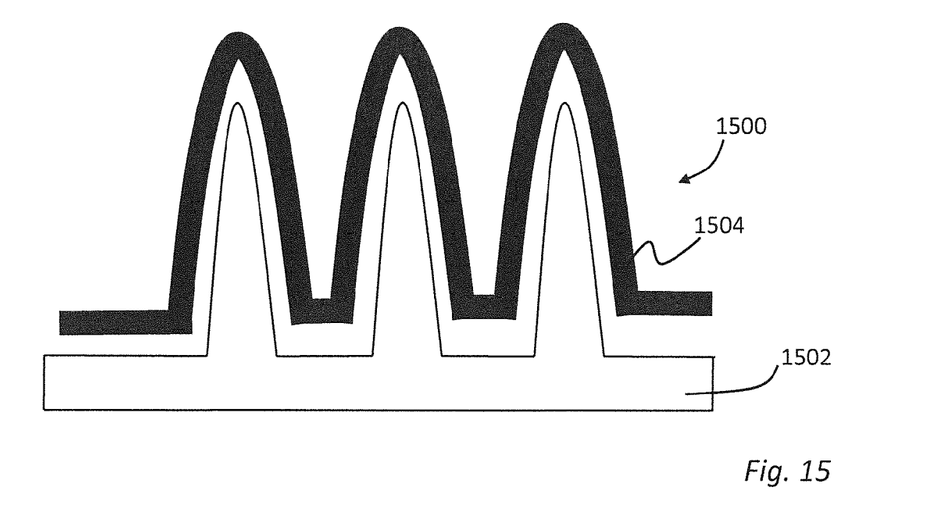
FIG. 15 is a schematic diagram of a highly simplified device.

An alternative embodiment is a semiconductor device comprising a highly structured surface as described above. A highly simplified device 1500 is illustrated in FIG. 15. Most practical devices include many layers having diverse functionality. Many of the various active and inactive layers necessary to complete an operational device are not included in the simplified schematic of FIG. 15. The device 1500 includes a highly structured surface; substrate 1502. The device further includes a conformal coating layer 1504 applied, deposited or grown upon the highly structured surface such that the conformal coating substantially contiguously coats both a direct deposition surface and an indirect deposition surface. Alternative embodiments include an electronic device of any complexity prepared according to the methods disclosed herein. The device may be, but is not limited to a photovoltaic cell, a fuel cell, an LED or a battery.

Various embodiments of the disclosure may also include permutations of the various elements recited in the claims as if each dependent claim was a multiple dependent claim incorporating the limitations of each of the preceding dependent claims as well as the independent claims. Such permutations are expressly within the scope of this disclosure.

While a number of exemplary aspects and embodiments have been discussed above, those of skill in the art will recognize certain modifications, permutations, additions and sub combinations thereof. It is therefore intended that the following appended claims and claims hereafter introduced are interpreted to include all such modifications, permutations, additions and sub-combinations as are within their true spirit and scope. All references cited herein are incorporated in their entirety by reference for all matters disclosed therein.

What is claimed is:

1. A method of applying a conformal coating to a highly structured substrate comprising:
   providing a deposition process chamber comprising a deposition source;
   associating a surface with the deposition process chamber wherein the surface comprises a direct deposition surface having a substantial surface area not shaded from the deposition source and the surface further comprises an indirect deposition surface having a substantial surface area at least partially shaded from the deposition source;
   depositing a substantially contiguous layer of a material having an amorphous structure on the direct deposition surface and the indirect deposition surface at a deposition pressure of equal to or less than about 3 mTorr;
   removing a portion of the amorphous material deposited on the direct deposition surface; and
   depositing additional amorphous material on the direct deposition surface and the indirect deposition surface.

2. The method of applying a conformal coating to a highly structured surface of claim 1 wherein the amorphous material is deposited at a deposition pressure of equal to or less than about 0.5 mTorr.

3. The method of applying a conformal coating to a highly structured surface of claim 1 wherein the amorphous material is deposited by RF-DC mixed sputtering.

4. The method of applying a conformal coating to a highly structured surface of claim 1 further comprising depositing the amorphous material without supplemental heating of the highly structured surface.

5. The method of applying a conformal coating to a highly structured surface of claim 1 further comprising depositing a substantially contiguous layer of a transparent conducting oxide having an amorphous structure on the direct deposition surface and the indirect deposition surface.

6. The method of applying a conformal coating to a highly structured surface of claim 5 further comprising depositing an InZnO alloy having amorphous structure.

7. The method of applying a conformal coating to a highly structured surface of claim 1 further comprising removing a portion of the amorphous material deposited on the direct deposition surface by ion milling.

8. The method of applying a conformal coating to a highly structured surface of claim 1 further comprising applying a protective coating to the indirect deposition surface.

9. The method of applying a conformal coating to a highly structured surface of claim 8 further comprising removing a portion of the amorphous material deposited on the direct deposition surface by one of ion milling and chemical etching.

10. A method of applying a conformal coating to a highly structured surface comprising:
    providing a deposition process chamber comprising a deposition source;
    associating a surface with the deposition process chamber wherein the surface comprises multiple direct deposition surfaces having a substantial surface area not shaded from the deposition source and the surface further comprises multiple indirect deposition surfaces having a substantial surface area at least partially shaded from the deposition source;
    depositing a substantially contiguous layer of a material having a substantially amorphous structure on the direct deposition surface and the indirect deposition surface;
    removing a portion of the amorphous material deposited on the direct deposition surface; and
    depositing additional amorphous material on the direct deposition surface and the indirect deposition surface.

11. The method of applying a conformal coating to -a highly structured surface of claim 10 further comprising removing a portion of the amorphous material deposited on the direct deposition surface by ion milling.

12. The method of applying a conformal coating to a highly structured surface of claim 10 further comprising applying a protective coating to the indirect deposition surface.

13. The method of applying a conformal coating to a highly structured surface of claim 12 further comprising removing a portion of the amorphous material deposited on the direct deposition surface by one of ion milling and chemical etching.

14. The method of applying a conformal coating to a highly structured surface of claim 10 wherein the amorphous material is deposited at a deposition pressure of equal to or less than about 0.5 mTorr.

15. The method of applying a conformal coating to a highly structured surface of claim 10 wherein the amorphous material is deposited by RF-DC mixed sputtering.

16. The method of applying a conformal coating to a highly structured surface of claim 10 further comprising depositing the amorphous material without supplemental heating of the highly structured surface.

17. The method of applying a conformal coating to a highly structured surface of claim 10 further comprising depositing a substantially contiguous layer of a transparent conducting oxide having an amorphous structure on the direct deposition surface and the indirect deposition surface.

18. The method of applying a conformal coating to a highly structured surface of claim 17 further comprising depositing an InZnO alloy having a substantially amorphous structure.

\* \* \* \* \*